United States Patent
Morimitsu

(10) Patent No.: US 11,789,053 B2
(45) Date of Patent: Oct. 17, 2023

(54) RESISTANCE MEASUREMENT DEVICE, FILM MANUFACTURING APPARATUS, AND MANUFACTURING METHOD OF ELECTRICALLY CONDUCTIVE FILM

(71) Applicant: NITTO DENKO CORPORATION, Ibaraki (JP)

(72) Inventor: Daiki Morimitsu, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 575 days.

(21) Appl. No.: 17/041,155

(22) PCT Filed: Dec. 17, 2018

(86) PCT No.: PCT/JP2018/046375
§ 371 (c)(1),
(2) Date: Sep. 24, 2020

(87) PCT Pub. No.: WO2019/187393
PCT Pub. Date: Oct. 3, 2019

(65) Prior Publication Data
US 2021/0011065 A1    Jan. 14, 2021

(30) Foreign Application Priority Data

Mar. 27, 2018 (JP) .................. 2018-059780

(51) Int. Cl.
*G01R 27/08* (2006.01)
*G01R 35/00* (2006.01)
(Continued)

(52) U.S. Cl.
CPC .............. *G01R 27/08* (2013.01); *C23C 14/54* (2013.01); *G01R 35/00* (2013.01); *G01R 31/002* (2013.01)

(58) Field of Classification Search
CPC ........ G01R 27/00; G01R 27/02; G01R 27/08; G01R 31/00; G01R 31/001; G01R 31/002;
(Continued)

(56) References Cited

U.S. PATENT DOCUMENTS 6,086,734 A    7/2000 Harada
6,657,439 B1   12/2003 Harada
(Continued)

FOREIGN PATENT DOCUMENTS

CN    102239276 A    11/2011
EP    3339828 A1 *  6/2018  ............. G01K 17/08
(Continued)

OTHER PUBLICATIONS

JP2011185797A English Translation (Year: 2011).*
(Continued)

*Primary Examiner* — Hoai-An D. Nguyen
(74) *Attorney, Agent, or Firm* — WHDA, LLP

(57) ABSTRACT

A resistance measurement device for measuring sheet resistance of an electrically conductive film being long in one direction includes two probes disposed to face each other in spaced apart relation so as to allow the electrically conductive film to be interposed therebetween without contacting with the electrically conductive film; a scanning unit that allows the two probes to scan in a cross direction crossing the one direction; and an arithmetic unit that calculates a sheet resistance of the electrically conductive film based on a voltage measured by the two probes. The arithmetic unit includes a memory that memorizes a reference voltage measured by allowing the two probes to scan in the cross direction without interposing the electrically conductive film between the probes. The arithmetic unit corrects an actual voltage by allowing the two probes to scan in the cross
(Continued)

direction with the electrically conductive film being interposed between the probes.

4 Claims, 4 Drawing Sheets

(51) Int. Cl.
*C23C 14/54* (2006.01)
*G01R 31/00* (2006.01)

(58) Field of Classification Search
CPC . G01R 35/00; G01R 1/00; G01R 1/02; G01R 1/06; G01R 1/067; G01R 1/073; G01R 1/07392; G01R 19/00; G01R 19/0084; G01R 19/0092; C23C 14/00; C23C 14/06; C23C 14/14; C23C 14/20; C23C 14/205; C23C 14/22; C23C 14/34; C23C 14/52; C23C 14/54; C23C 14/542; C23C 14/545; C23C 14/56; C23C 14/562
USPC ............... 324/600, 649, 691, 500, 512, 525
See application file for complete search history.

(56) References Cited

U.S. PATENT DOCUMENTS

| | | | |
|---|---|---|---|
| 11,237,196 B2 * | 2/2022 | Morimitsu | ............ C23C 14/54 |
| 2010/0219806 A1 * | 9/2010 | Uchida | .................. G01R 1/07 324/72 |
| 2011/0084706 A1 * | 4/2011 | Hansen | ................ G01R 35/00 324/601 |
| 2011/0203734 A1 | 8/2011 | Koji | |

FOREIGN PATENT DOCUMENTS

| | | | | | |
|---|---|---|---|---|---|
| JP | 60-249067 | A | | 12/1985 | |
| JP | 2000-74634 | A | | 3/2000 | |
| JP | 2000-314754 | A | | 11/2000 | |
| JP | 3313189 | B2 | * | 8/2002 | ............ B65B 57/02 |
| JP | 2003-197034 | A | | 7/2003 | |
| JP | 2010153797 | A | * | 7/2010 | ......... H01L 21/6835 |
| JP | 2011185797 | A | * | 9/2011 | ............ G01R 27/02 |
| JP | 2012-73132 | A | | 4/2012 | |
| TW | 473827 | B | | 1/2002 | |
| WO | 2017/158895 | A1 | | 9/2017 | |

OTHER PUBLICATIONS

International Search Report dated Feb. 19, 2019, issued in counterpart International Application No. PCT/JP2018/046375 (1 page).
Office Action dated Jan. 6, 2023, issued in counterpart TW Application No. 108100962, with English translation. (5 pages).
Office Action dated Jan. 26, 2022, issued in counterpart TW application No. 108100962, with English translation. (11 pages).
Office Action dated Jan. 19, 2022, issued in counterpart CN application No. 201880090994.7, with English translation. (11 pages).
Notification Concerning Transmittal of International Preliminary Report on Patentability (Forms PCT/IB/326) issued in counterpart International Application No. PCT/JP2018/046375 dated Sep. 29, 2020 with Forms PCT/IB/373, PCT/IB/338 and PCT/ISA/237, with English Translation. (11 pages).
Office Acction dated Jul. 14, 2022, issued in counterpart TW applilcation No. 108100962 with English translation. (15 pages).

* cited by examiner

RESISTANCE MEASUREMENT DEVICE, FILM MANUFACTURING APPARATUS, AND MANUFACTURING METHOD OF ELECTRICALLY CONDUCTIVE FILM

TECHNICAL FIELD

The present invention relates to a resistance measurement device, a film manufacturing apparatus, and a method for manufacturing an electrically conductive film.

BACKGROUND ART

An electrically conductive film has been conventionally manufactured by laminating an electrically conductive layer on a substrate film in a roll-to-roll method. The manufactured electrically conductive film is required to have surface resistance (sheet resistance) within a desired range, so that a quality defect of the surface resistance needs to be discovered by measuring the surface resistance. A method has been known in which the surface resistance of the electrically conductive film is measured by using a non-contact resistance measurement device before winding the electrically conductive film (ref: for example, Patent Document 1).

The non-contact surface resistance measurement device of Patent Document 1 includes an eddy current sensor consisting of an eddy current generating portion and an eddy current detection portion, and a separation distance sensor for detecting a distance between the eddy current sensor and the electrically conductive layer.

In the device of Patent Document 1, the separation distance sensor detects a distance between the eddy current sensor and the electrically conductive layer, a correction value corresponding to a detection result is considered, and the surface resistance of the electrically conductive film is calculated. Thus, a measurement error caused by unevenness of the distance between the eddy current sensor and the electrically conductive layer of the electrically conductive film being conveyed can be reduced.

CITATION LIST

Patent Document

Patent Document 1: Japanese Unexamined Patent Publication No. 2003-197034

SUMMARY OF THE INVENTION

Problem to be Solved by the Invention

The non-contact resistance measurement device has two types, double-sided probe-type and one-sided probe-type, in view of probes. The double-sided probe-type (probes facing-type) includes two probes disposed to face each other in spaced apart relation on both sides (upper side and lower side) of the electrically conductive film so as not to be in contact with the electrically conductive film. Meanwhile, the one-sided probe-type includes one probe disposed only on one side (upper side) of the electrically conductive film at a spaced interval so as not to be in contact with the electrically conductive film. Generally, the one-sided probe-type needs to dispose the probe at a position that is extremely close to the electrically conductive film compared to the double-sided probe-type. Thus, the probe may be brought into contact with the electrically conductive film due to flapping of the electrically conductive film in an up-down direction during the conveyance. Therefore, the use of the double-sided probe-type is considered.

The resistance measurement device has two types, fixing-type and traverse-type, in view of variability of a measurement position. In the fixing-type, a position of the probe is fixed, and the electrically conductive film is measured. In the traverse-type, the electrically conductive film is measured, while the probe is moved in a width direction (direction perpendicular to a conveyance direction) of the electrically conductive film. The traverse-type has advantages in view of capability of measuring a freely-selected portion in the width direction in addition to a freely-selected portion in the conveyance direction of the electrically conductive film.

By considering these points, a method of measuring the electrically conductive film with a double-sided probe-type and traverse-type resistance measurement device is considered.

In this method, however, there is a disadvantage that when each of the two probes disposed to face each other is moved in the width direction with a moving device such as guiding, a distance in the up-down direction between the two probes slightly deviates. Although the moving device is designed to have a uniform distance in the up-down direction between the two probes, the non-contact resistance measurement device is sensitively affected by even slight unevenness of the distance in the up-down direction of the moving device, where the distance is within a tolerance (for example, below 0.1 mm). Thus, an error is generated in the obtained surface resistance, and measurement accuracy is reduced.

Regarding this point, a method using the separation distance sensor described in Patent Document 1 is considered. In this method, however, a distance between the electrically conductive layer and a probe on one side can be measured, but a distance between the two probes cannot be measured, so that the above-described disadvantage cannot be solved.

The present invention provides a resistance measurement device that is capable of improving measurement accuracy on the measurement of sheet resistance, the measurement in which a probes facing-type non-contact resistance measurement device is used and the sheet resistance is measured while moving the probes in a width direction of an electrically conductive film; a film manufacturing apparatus; and a method for manufacturing an electrically conductive film.

Means for Solving the Problem

The present invention [1] includes a resistance measurement device for measuring sheet resistance of an electrically conductive film that is long in one direction, including two probes disposed to face each other in spaced apart relation so as to allow the electrically conductive film to be interposed therebetween without contacting with the electrically conductive film; a scanning unit that allows the two probes to scan in a cross direction crossing the one direction; and an arithmetic unit that calculates a sheet resistance of the electrically conductive film based on a voltage measured by the two probes, wherein the arithmetic unit includes a memory that memorizes a reference voltage measured by allowing the two probes to scan in the cross direction without interposing the electrically conductive film between the probes, and corrects, based on the reference voltage, an actual voltage measured by allowing the two probes to scan in the cross direction with the electrically conductive film being interposed between the probes.

The resistance measurement device, first, memorizes the reference voltage measured by allowing the two probes to scan in the cross direction without interposing the electrically conductive film between the probes. That is, on scanning, a change in the voltage generated by deviation of a distance in an up-down direction between the probes is memorized as the reference voltage. Then, the actual voltage of the electrically conductive film is corrected based on the memorized reference voltage, and the sheet resistance is calculated.

Thus, the sheet resistance, considering the influence of the deviation of the distance in the up-down direction between the probes, of the electrically conductive film can be calculated, and measurement accuracy (preciseness of measurement) of the sheet resistance of the electrically conductive film can be improved.

The present invention [2] includes the resistance measurement device described in [1] or [2], wherein a distance between the two probes is variable.

In the resistance measurement device, the distance between the probes can be changed, so that the distance in the up-down direction between the probes can be adjusted to be optimal in accordance with a thickness of the electrically conductive film Thus, setting of the resistance measurement device is easily adjusted. When the distance between the probes is changed, the actual voltage is corrected based on the reference voltage, so that the precise sheet resistance can be obtained regardless of the distance between the probes.

The present invention [3] includes a film manufacturing apparatus for manufacturing an electrically conductive film that is long in one direction, including a lamination unit that laminates an electrically conductive layer at a substrate film that is long in the one direction to produce an electrically conductive film; a conveyance unit that conveys the electrically conductive film; and the resistance measurement device described in [1] or [2] that measures sheet resistance of the electrically conductive film conveyed by the conveyance unit.

The film manufacturing apparatus is provided with the above-described resistance measurement device, so that a defect of the sheet resistance can be precisely detected. Accordingly, the electrically conductive film having the defective sheet resistance can be surely considered. Thus, the electrically conductive film having the furthermore uniform sheet resistance can be manufactured.

The present invention [4] includes a method for manufacturing an electrically conductive film that is long in one direction, including a lamination step of laminating an electrically conductive layer at a substrate film that is long in the one direction to produce an electrically conductive film; and a resistance measurement step of measuring sheet resistance of the electrically conductive film while conveying the electrically conductive film in the one direction, wherein the resistance measurement step includes a reference voltage measurement step of measuring a reference voltage by allowing two probes to scan in a cross direction crossing the one direction without interposing the electrically conductive film between the two probes disposed to face each other in spaced apart relation, an actual voltage measurement step of measuring an actual voltage of the electrically conductive film by allowing the two probes to scan in the cross direction, the electrically conductive film being interposed between the two probes without being contacted with the two probes; and a calculation step of correcting the actual voltage based on the reference voltage, and calculating the sheet resistance of the electrically conductive film.

In the method for manufacturing an electrically conductive film, first, the reference voltage is measured by allowing the two probes to scan in the cross direction without interposing the electrically conductive film between the probes. That is, on scanning, a change in the voltage generated by the distance in the up-down direction between the probes is measured as the reference voltage. Then, the actual voltage of the electrically conductive film is corrected based on the measured reference voltage, and the sheet resistance is calculated.

Thus, the sheet resistance, considering the influence of the deviation of the distance in the up-down direction between the probes, of the electrically conductive film can be calculated, and the measurement accuracy (preciseness of measurement) of the sheet resistance of the electrically conductive film is improved. Accordingly, the defect of the sheet resistance of the electrically conductive film can be precisely detected, and the electrically conductive film having the defective sheet resistance can be surely considered. As a result, the electrically conductive film having the uniform sheet resistance can be manufactured.

Effect of the Invention

According to the resistance measurement device of the present invention, measurement accuracy of sheet resistance of an electrically conductive film can be improved.

According to the film manufacturing apparatus and the method for manufacturing an electrically conductive film of the present invention, an electrically conductive film having uniform sheet resistance can be manufactured.

BRIEF DESCRIPTION OF THE DRAWINGS

FIG. 3A illustrating a front view and

FIG. 3B illustrating a plan view.

DESCRIPTION OF EMBODIMENTS

Figure 1:
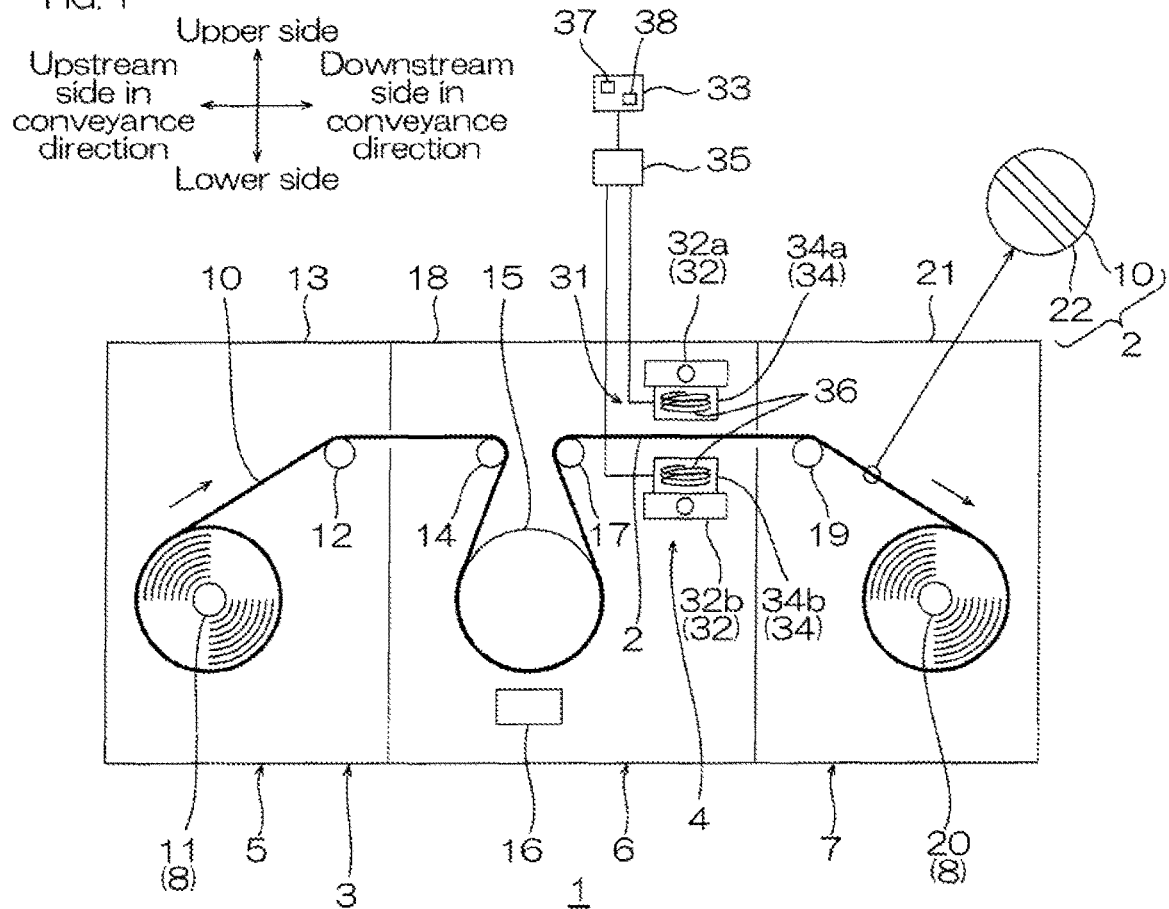
FIG. 1 shows one embodiment of a film manufacturing apparatus of the present invention.

In FIG. 1, the right-left direction on the plane of the sheet is a conveyance direction (first direction, longitudinal direction, one direction), the right side on the plane of the sheet is a downstream side in the conveyance direction (one side in the first direction, one side in the longitudinal direction), and the left side on the plane of the sheet is an upstream side in the conveyance direction (the other side in the first direction, the other side in the longitudinal direction). The paper thickness direction is a width direction (second direction perpendicular to the first direction), the near side on the plane of the sheet is one side in the width direction (one side in the second direction), and the depth side on the plane of the sheet is the other side in the width direction (the other side in the second direction). The up-down direction on the plane of the sheet is an up-down direction (third direction perpendicular to the first direction and the second direction, thickness direction), the upper side on the plane of the sheet is an upper side (one side in the third direction, one side in the thickness direction), and the lower side on the plane of the sheet is a lower side (the other side in the third direction, the other side in the thickness direction). Directions in views other than FIG. 1 are also in conformity with those of FIG. 1.

One Embodiment

1. Film Manufacturing Apparatus

A film manufacturing apparatus 1 of one embodiment of the present invention is described with reference to FIGS. 1 to 3. The film manufacturing apparatus 1 shown in FIG. 1 is an apparatus for manufacturing an electrically conductive film 2 that is long in length in the conveyance direction (one direction), and includes a lamination conveyance device 3 and a resistance measurement device 4.

[Lamination Conveyance Device]

As shown in FIG. 1, the lamination conveyance device 3 includes a feeding unit 5, a sputtering unit 6 as one example of a lamination unit, and a winding unit 7.

The feeding unit 5 includes a feeding roll 11, a first guiding roll 12, and a feeding chamber 13.

The feeding roll 11 is a columnar member, having a rotation axis, for feeding a substrate film 10. The feeding roll 11 is disposed at the most upstream-side in the conveyance direction of the lamination conveyance device 3. A motor (not shown) for rotating the feeding roll 11 is connected to the feeding roll 11.

The first guiding roll 12 is a rotation member that guides the substrate film 10 fed out from the feeding roll 11 to the sputtering unit 6. The first guiding roll 12 is disposed at the downstream side in the conveyance direction of the feeding roll 11 and the upstream side in the conveyance direction of a second guiding roll 14 (described later).

The feeding chamber 13 is casing for housing the feeding roll 11 and the first guiding roll 12. The feeding chamber 13 is provided with a vacuum unit enabling vacuumization of the inside of the feeding chamber 13.

In the sputtering unit 6, an electrically conductive layer 22 (described later) is laminated on the substrate film 10, conveyed from the feeding unit 5, by a sputtering method. The sputtering unit 6 is disposed at the downstream side in the conveyance direction of the feeding unit 5 and the upstream side in the conveyance direction of the winding unit 7 so as to be adjacent to the feeding unit 5 and the winding unit 7. The sputtering unit 6 includes the second guiding roll 14, a film-forming roll 15, a target 16, a third guiding roll 17, and a film-forming chamber 18.

The second guiding roll 14 is a rotation member that guides the substrate film 10 conveyed from the feeding unit 5 to the film-forming roll 15. The second guiding roll 14 is disposed at the downstream side in the conveyance direction of the first guiding roll 12 and the upstream side in the conveyance direction of the film-forming roll 15.

The film-forming roll 15 is a columnar member, having a rotation axis, for laminating the electrically conductive layer 22 on the substrate film 10. The film-forming roll 15 conveys the substrate film 10 along a circumferential surface of the film-forming roll 15 in a circumferential direction thereof. The film-forming roll 15 is disposed at the downstream side in the conveyance direction of the second guiding roll 14 and the upstream side in the conveyance direction of the third guiding roll 17.

The target 16 is formed from a material for the electrically conductive layer 22. The target 16 is disposed around the film-forming roll 15. To be specific, the target 16 is disposed to face the film-forming roll 15 at the lower side thereof in spaced apart relation to the film-forming roll 15.

The third guiding roll 17 is a rotation member that guides the electrically conductive film 2 conveyed from the film-forming roll 15 to the winding unit 7 via the resistance measurement device 4. The third guiding roll 17 is disposed at the downstream side in the conveyance direction of the second guiding roll 14 and the upstream side in the conveyance direction of a fourth guiding roll 19 (described later).

The film-forming chamber 18 is a casing for housing the second guiding roll 14, the film-forming roll 15, the target 16, the third guiding roll 17, and the resistance measurement device 4 (described later). The film-forming chamber 18 is provided with a vacuum unit enabling vacuumization of the inside thereof.

The winding unit 7 includes the fourth guiding roll 19, a winding roll 20, and a winding chamber 21. The winding unit 7 is disposed at the downstream side in the conveyance direction of the sputtering unit 6 so as to be adjacent thereto.

The fourth guiding roll 19 is a rotation member that guides the electrically conductive film 2 conveyed from the sputtering unit 6 to the winding roll 20. The fourth guiding roll 19 is disposed at the downstream side in the conveyance direction of the third guiding roll 17 and the upstream side in the conveyance direction of the winding roll 20.

The winding roll 20 is a columnar member, having a rotation axis, for winding the electrically conductive film 2. The winding roll 20 is disposed at the most downstream-side in the conveyance direction of the substrate film 10. A motor (not shown) for rotating the winding roll 20 is connected to the winding roll 20.

The winding chamber 21 is a casing for housing the winding roll 20 and the fourth guiding roll 19. The winding chamber 21 is provided with a vacuum unit for enabling vacuumization of the inside of the winding chamber 21.

The feeding roll 11 and the winding roll 20 constitute one example of a conveyance unit 8.

[Resistance Measurement Device]

As shown in FIG. 1, the resistance measurement device 4 is disposed at the inside of the sputtering unit 6. To be specific, the resistance measurement device 4 is disposed at the downstream side in the conveyance direction of the film-forming roll 15 and the third guiding roll 17 and the upstream side in the conveyance direction of the fourth guiding roll 19 and the winding roll 20.

Figure 2:
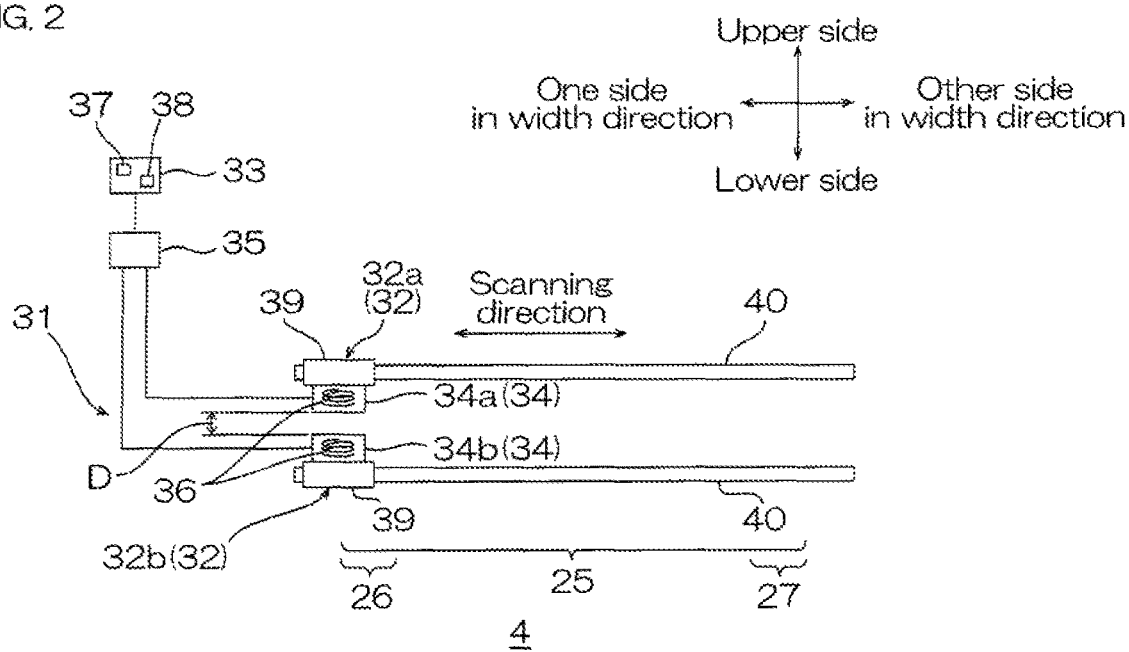
FIG. 2 shows a front view of a resistance measurement device provided in the film manufacturing apparatus shown in FIG. 1.
Figure 3A:
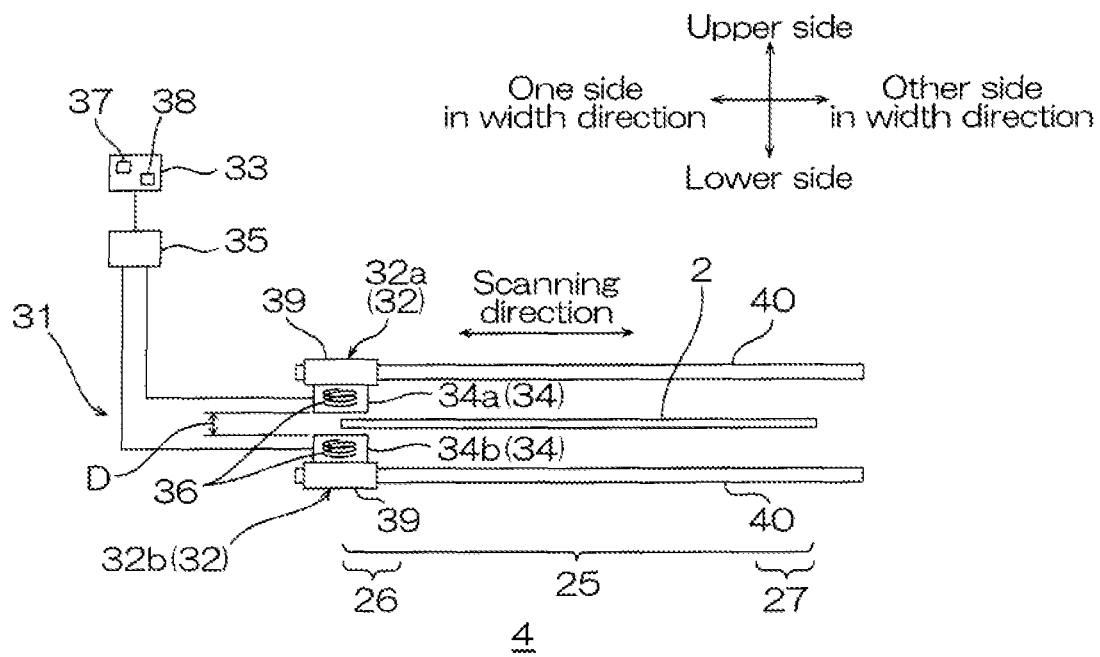
FIGS. 3A and 3B show operation explanatory views of the resistance measurement device shown in FIG. 2 during conveyance of an electrically conductive film.
Figure 3B:
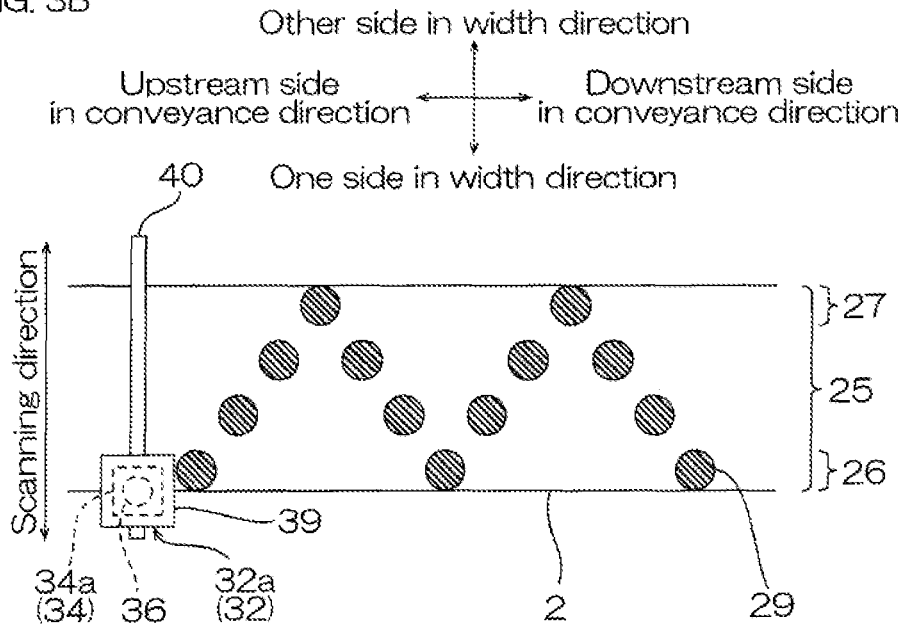

As shown in FIGS. 2 and 3A to 3B, the resistance measurement device 4 includes a probes facing-type non-contact resistance measurement unit 31 (hereinafter, also abbreviated as a measurement unit 31), a scanning unit 32, and an arithmetic unit 33.

The measurement unit 31 is a unit that measures sheet resistance of the electrically conductive film 2 in a state of not being in contact with the electrically conductive film 2 (object to be measured). To be specific, the measurement unit 31 is an eddy current-type measurement unit. In the measurement unit 31, an eddy current is generated in the electrically conductive film 2 by applying a magnetic field thereto, and the sheet resistance of the electrically conductive film 2 is measured by using a change in an electric current flowing in a coil 36 due to the influence of the eddy current.

The measurement unit 31 includes two probes 34 and a measurement circuit unit 35.

The two probes 34 are a unit that receives information (magnetic field or the like) from the electrically conductive film 2. To be specific, the two probes 34 apply the magnetic field to the electrically conductive film 2, and convert a diamagnetic field due to the eddy current of the electrically conductive film 2 into the electric current.

The two probes 34 are disposed to face each other at a spaced interval. The two probes 34 include an upper-side probe 34a disposed at the upper side of the electrically conductive film 2 in spaced apart relation to the film, and a lower-side probe 34b disposed at the lower side of the electrically conductive film 2 in spaced apart relation to the film. A distance in the up-down direction between the two probes 34 is variable. That is, at least one of an upper-side scanning unit 32a and a lower-side scanning unit 32b to be described later is movable and fixable in the up-down direction.

Each of the two probes 34 includes the coil 36. The coil 36 disposed in the upper-side probe 34a and the coil 36 disposed in the lower-side probe 34b are provided so as to have substantially the same shape when projected in the up-down direction.

Each of the coils 36 has a generally circular ring shape when viewed from the top, and has a diameter of, for example, 100 mm or less, preferably 80 mm or less, and more preferably 40 mm or less; and for example, 10 mm or more. When the diameter of the coil 36 is the above-described upper limit or less, the minimum area of a measurement spot 29 (described later) at which the probe 34 can detect the sheet resistance can be reduced, and sensitivity (resolution) in the width direction thereof can be improved.

A distance D in the up-down direction (probe gap) between the two probes 34 is, for example, 5 mm or more, preferably 10 mm or more; and for example, 30 mm or less, preferably 15 mm or less.

The measurement circuit unit 35 is a unit including an electric circuit that is electrically connected to the two coils 36. The measurement circuit unit 35 includes, for example, an element required for driving the measurement unit 31 such as high-frequency oscillator, condenser, voltmeter, ammeter, and I-V conversion circuit.

The scanning unit 32 is a unit for moving the two probes 34 in the width direction (direction perpendicular to the conveyance direction: one example of a cross direction). The scanning unit 32 reciprocates the two probes 34 between one end portion 26 in the width direction and an other end portion 27 in the width direction of a conveyance region 25 (described later), while relative arrangement (facing arrangement) of the two probes 34 is retained.

The scanning unit 32 includes the upper-side scanning unit 32a and the lower-side scanning unit 32b.

The upper-side scanning unit 32a includes a slider 39 that retains the upper-side probe 34a on the lower surface (the other-side surface in the thickness direction) thereof, and a linear guiding axis (traverse axis) 40 crossing both end edges of the conveyance region 25 in the width direction. In the upper-side scanning unit 32a, the slider 39 outer-fits the guiding axis 40 slidably, and the slider 39 linearly moves so as to traverse the conveyance region 25 in the width direction along the guiding axis 40 by a driving force of a motor that is not shown.

The lower-side scanning unit 32b includes the slider 39 that retains the lower-side probe 34b on the upper surface (one-side surface in the thickness direction) thereof, and the linear guiding axis (traverse axis) 40 crossing both end edges of the conveyance region 25 in the width direction.

These are the same as the slider 39 and the guiding axis 40 of the upper-side scanning unit 32a.

The arithmetic unit 33 includes a memory 37 and a CPU 38.

The memory 37 memorizes data of a reference voltage measured by the measurement unit 31. To be specific, the memory 37 memorizes a profile showing a relationship between the reference voltage and a position in the width direction of the probe 34 at which the reference voltage is measured.

The memory 37 also memorizes the data of the actual voltage of the electrically conductive film 2 measured by the measurement unit 31, and an arithmetic program that calculates a sheet resistance of the electrically conductive film 2 based on the data of the actual voltage and the data of the reference voltage.

The CPU 38 runs the above-described arithmetic program to correct the actual voltage based on the reference voltage, and to calculate the sheet resistance by a known calculation formula using the corrected actual voltage (correction voltage).

2. Method for Manufacturing Film

One embodiment of a method for manufacturing the electrically conductive film 2 by using the film manufacturing apparatus 1 is described. The method for manufacturing the electrically conductive film 2 includes a lamination step, a resistance measurement step, and a selection step.

[Lamination Step]

In the lamination step, the electrically conductive layer 22 is laminated on the substrate film 10, while the substrate film 10 is conveyed. To be specific, the electrically conductive layer 22 is formed on the surface of the substrate film 10 by the sputtering method, while the substrate film 10 is conveyed (ref: enlarged view of FIG. 1).

First, the substrate film 10 that is long in length in the conveyance direction is disposed in the feeding roll 11. That is, a rolled body obtained by winding the long-length substrate film 10 in a rolled shape is mounted on the feeding roll 11.

An example of the substrate film 10 includes a polymer film. Examples of a material for the polymer film include polyester resins such as polyethylene terephthalate, polybutylene terephthalate, and polyethylene naphthalate; (meth)acrylic resins such as polymethacrylate; olefin resins such as polyethylene, polypropylene, and cycloolefin polymer; polycarbonate resin; polyether sulfone resin; polyarylate resin; melamine resin; polyimide resin; polyimide resin; cellulose resin; and polystyrene resin.

A length in the width direction of the substrate film 10 (that is, length in the width direction of the conveyance region 25) is, for example, 100 mm or more, and preferably 200 mm or more; and for example, 5000 mm or less, preferably 2000 mm or less.

Next, the feeding roll 11 and the winding roll 20 are rotationally driven by a motor to feed the substrate film 10 out from the feeding roll 11. Then, the substrate film 10 is sequentially conveyed to the first guiding roll 12, the second guiding roll 14, the film-forming roll 15, the third guiding roll 17, and the fourth guiding roll 19 to be wound around the winding roll 20.

A conveyance rate of the substrate film 10 (conveyance rate of the electrically conductive film 2) is, for example, 10 mm/sec or more, and preferably 100 mm/sec or more; and for example, 500 mm/sec or less, preferably 300 mm/sec or less.

In this manner, the substrate film 10 is conveyed from the feeding roll 11 to the winding roll 20 in the conveyance direction in a roll-to-roll method (conveyance step).

Next, sputtering is carried out. That is, the sputtering unit 6 is activated, and the electrically conductive layer 22 is formed on the substrate film 10.

To be specific, gas (argon or the like) is supplied to the inside of the film-forming chamber 18 under vacuum, and a voltage is applied thereto, so that the gas collides with the target 16. As a result, a target material sprung out from the target 16 is, below the film-forming roll 15, attached to the lower surface of the substrate film 10 that is conveyed from the upstream side in the conveyance direction, thereby forming the electrically conductive layer 22.

Examples of a material for the target 16, that is, a material for the electrically conductive layer 22 include metal oxides such as indium tin composite oxide and antimony tin composite oxide; metal nitrides such as aluminum nitride, titanium nitride, tantalum nitride, chromium nitride, gallium nitride, and composite nitride thereof; and metals such as gold, silver, copper, nickel, and alloy thereof.

In this manner, the electrically conductive film 2 including the substrate film 10 and the electrically conductive layer 22 laminated on the lower surface thereof is produced at the lower side of the film-forming roll 15 (electrically conductive layer forming step).

Thereafter, the electrically conductive film 2 produced at the lower side of the film-forming roll 15 is conveyed toward the resistance measurement device 4 at the downstream side in the conveyance direction by the film-forming roll 15 and the third guiding roll 17.

[Resistance Measurement Step]

Figure 4:
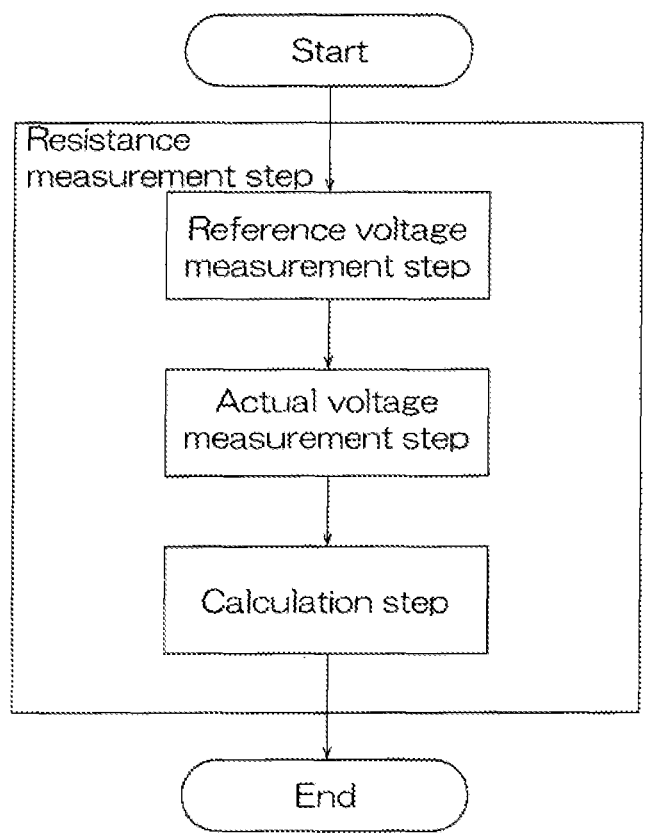
FIG. 4 shows a flow chart of a resistance measurement step in one embodiment of a method for manufacturing an electrically conductive film of the present invention.

In the resistance measurement step, the sheet resistance of the electrically conductive film 2 is measured, while the electrically conductive film 2 is conveyed in the conveyance direction. As shown in a flow chart of FIG. 4, the resistance measurement step includes a reference voltage measurement step, an actual voltage measurement step, and a calculation step.

(Reference Voltage Measurement Step)

As shown in FIG. 2, in the reference voltage measurement step, the voltage is measured, while the two probes 34 scan in the width direction in a state where the electrically conductive film 2 is not interposed between the two probes 34.

The reference voltage measurement is carried out before the electrically conductive film 2 is conveyed. The reference voltage measurement is carried out before the substrate film 10 is conveyed, that is, with respect to an air space, or carried out before the sputtering unit 6 is activated, that is, with respect to the substrate film 10 on which the electrically conductive layer 22 is not laminated.

The two probes 34 scan between one end portion in the width direction and the other end portion in the width direction of the scanning unit 32. That is, the two probes 34 move between one end portion 26 in the width direction and the other end portion 27 in the width direction of the conveyance region 25.

The conveyance region 25 is a region that is overlapped with the conveyed electrically conductive film 2 when projected in the up-down direction (thickness direction), and a length in the width direction of the conveyance region 25 matches the length in the width direction of the electrically conductive film 2.

The voltage is measured by activating the measurement unit 31. That is, a magnetic field is applied between the two probes 34, and the voltage of the electric current flowing in the measurement circuit unit 35 is detected.

Figure 5:
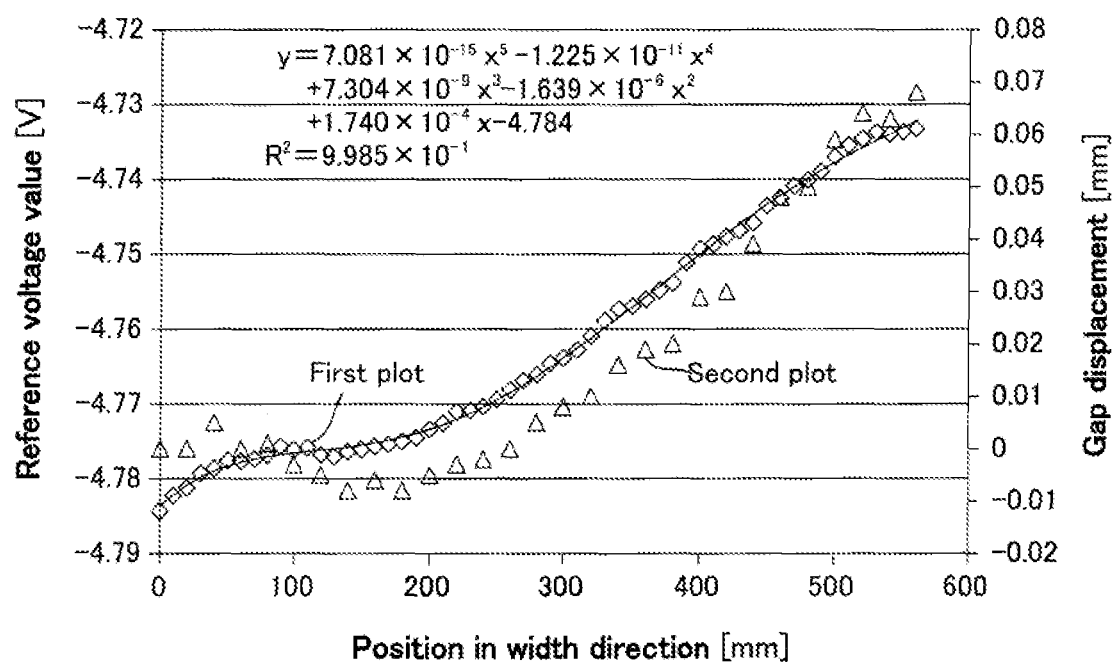
FIG. 5 shows a graph overlapping a relationship between a reference voltage and a position in a width direction with a relationship between probe gap displacement and the position in the width direction.

In this manner, the data of the voltage in a state of an absence of the electrically conductive film 2 (empty state), that is, the data of the reference voltage is measured. To be specific, a profile (graph) showing a relationship between a position in the width direction of the probe 34 (horizontal axis) and an empty voltage (vertical axis) at the position in the width direction is obtained (ref: FIG. 5).

Next, an approximate formula is produced from the data of the reference voltage by using a known method (ref: FIG. 5).

The reference voltage data including the profile and the approximate formula is memorized in the memory 37 by the arithmetic unit 33.

(Actual Voltage Measurement Step)

As shown in FIGS. 3A and 3B, in the actual voltage measurement step, an actual voltage of the electrically conductive film 2 is measured, while the two probes 34 scan in the width direction.

To be specific, the measurement is carried out in a state where the electrically conductive film 2 is interposed between the two probes 34 with the electrically conductive film 2 being not in contact with the two probes 34. That is, when the conveyed electrically conductive film 2 passes between the two probes 34, the voltage of the film is measured.

The scanning in the width direction of the two probes 34 continues during the measurement. The two probes 34 reciprocate between one end portion 26 in the width direction and the other end portion 27 in the width direction of the conveyance region 25.

Each of the measurement spots 29 of the electrically conductive film 2 measured by the probe 34 has a generally circular shape that is larger than the coil 36 when viewed from the top. That is, a diameter of the measurement spot 29 is larger than a diameter of the coil 36.

As shown in FIG. 3B, a pattern consisting of an assembly of the plurality of measurement spots 29 (measurement pattern) has a wave shape proceeding in the conveyance direction when viewed from the top. Of the plurality of measurement spots 29, one end edge in the width direction of the measurement spot 29 disposed at the most one-side in the width direction matches one end edge in the width direction of the conveyance region 25, and the other end edge in the width direction of the measurement spot 29 disposed at the most other-side in the width direction matches the other end edge in the width direction of the conveyance region 25.

A scanning rate of the probe 34 is, for example, 10 min/sec or more, and preferably 100 mm/sec or more; and for example, 500 mm/sec or less, and preferably 300 mm/sec or less.

In this manner, the actual voltage is measured, and the data of the actual voltage is memorized in the memory 37. To be specific, a profile showing a relationship between measurement time (or measurement position) (horizontal axis) and the actual voltage at the time (vertical axis) is obtained.

The measurement position of the electrically conductive film 2 is calculated based on the measurement time, the conveyance rate of the electrically conductive film 2, and the scanning rate of the scanning unit 32.

(Calculation Step) The calculation step corrects the actual voltage based on the reference voltage to calculate a sheet resistance of the electrically conductive film 2.

That is, the actual voltage is corrected based on the reference voltage by, for example, four basic operations of arithmetic, and the sheet resistance is calculated by using a known calculation method. The sheet resistance is, for example, calculated by using the following calculation formula.

$$Pc = Et(Io + Ie)$$
$$\rho s = \frac{Et \cdot K}{Ie + Io}$$
$$Ie = R \cdot Ve$$
$$Io = R \cdot (Vo + V\alpha)$$

In formula, Pc shows a high-frequency power value, Et shows a high-frequency voltage value, Io shows a current value in the case of an absence of an object to be measured (the electrically conductive film 2), Ie shows an eddy current detection current value, ρs shows sheet resistance, K shows a coil coupling coefficient, R shows a resistance value of an I-V conversion circuit, Ve shows an eddy current detection voltage value, Vo shows a voltage value in the case of an absence of the object to be measured (the electrically conductive film 2), and Vα shows a reference voltage value.

The high-frequency voltage value Et changes by generation of the eddy current, and is controlled to be constant based on an error from a supply voltage. Ie and Io are converted to the voltage values (actual voltages) Ve and Vo by the I-V conversion circuit (resistance R). Calibration is carried out to obtain Vo as 0 [V] before the measurement of the electrically conductive film 2, and the sheet resistance is calculated only by Ve. Vo is corrected by the reference voltage value Vα, and the sheet resistance is calculated.

The actual voltage may be further corrected by considering the voltage other than the reference voltage (for example, a constant voltage caused by device characteristics of the measurement unit 31, a changed amount of the voltage due to coil temperature, or the like) as needed.

At this time, an actual voltage value and the position in the width direction at the measurement time (or the measurement position) is specified based on the data of the actual voltage and the data regarding the measurement position (scanning rate, conveyance rate, or the like), in calculation of the sheet resistance at a certain measurement time (or certain measurement position). Then, the sheet resistance is calculated by selecting, based on the data of the reference voltage (or approximate formula), the reference voltage value Vα at the position in the width direction.

In this manner, the data of the sheet resistance is obtained. To be specific, the profile showing a relationship between the measurement time (or the measurement position) and the sheet resistance at the measurement time is obtained.

[Selection Step]

In the selection step, the electrically conductive film 2 is selected based on the profile of the sheet resistance.

To be specific, when a plot showing a value (defective value) of the sheet resistance that is outside of a predetermined range is detected based on the profile, the measurement position showing the defective value is specified. Next, desired treatment (removal of the electrically conductive film 2; processing of the electrically conductive layer 22; feedback control of a film-forming process parameter such as gas and electric power; or the like) is carried out for the electrically conductive film 2 at the position.

In this manner, the uniform electrically conductive film 2 having the sheet resistance within a desired range is manufactured.

3. Function and Effect

The resistance measurement device 4 includes the two probes 34 disposed to face each other in spaced apart relation so as to allow the electrically conductive film 2 to be interposed between the probes without contacting with the electrically conductive film 2; the scanning unit 32 that allows the two probes 34 to scan in the width direction; and the arithmetic unit 33 that calculates a sheet resistance of the electrically conductive film 2 based on the voltage measured by the two probes 34. The arithmetic unit 33 includes the memory 37 that memorizes the reference voltage measured by allowing the two probes 34 to scan in the width direction without interposing the electrically conductive film 2 between the probes. Also, the arithmetic unit 33 corrects, based on the reference voltage, the actual voltage measured by allowing the two probes 34 to scan in the width direction with the electrically conductive film 2 interposed between the probes.

The resistance measurement device 4 memorizes the reference voltage measured by allowing the two probes 34 to scan in the width direction without interposing the electrically conductive film 2 between the probes. That is, on scanning, a change in the voltage generated by the deviation of the distance (probe gap) in the up-down direction between the two probes 34 is measured and memorized as the reference voltage. Then, the actual voltage of the electrically conductive film 2 is corrected based on the memorized reference voltage, and the sheet resistance is calculated.

Thus, the sheet resistance, considering the influence of the deviation of the distance in the up-down direction between the probes 34, of the electrically conductive film 2 can be calculated, and the measurement accuracy (preciseness of measurement) of the sheet resistance of the electrically conductive film 2 can be improved.

The resistance measurement device 4 includes the two probes 34 disposed to face each other without being in contact with the electrically conductive film 2. That is, the resistance measurement device 4 is a probes facing-type (double-sided probe-type). Thus, the resistance measurement device 4 can set a distance between the electrically conductive film 2 and the probe 34 wider than that of the one-sided probe-type. Accordingly, a contact of the electrically conductive film 2 with the probe 34 due to flapping of the electrically conductive film 2 during the conveyance can be suppressed.

The resistance measurement device 4 can measure the sheet resistance, while the two probes 34 scan in the width direction. That is, the resistance measurement device 4 is a traverse-type. Thus, the resistance measurement device 4 can measure a freely-selected portion in the width direction in addition to a freely-selected portion in the conveyance direction of the electrically conductive film 2.

In the resistance measurement device 4, the distance in the up-down direction between the two probes 34 is variable.

Thus, the distance in the up-down direction between the probes 34 can be adjusted to be optimal in accordance with a thickness of the electrically conductive film 2. Thus, setting of the resistance measurement device 4 is easily adjusted. When the distance between the probes 34 is changed, the actual voltage is corrected based on the reference voltage, so that the precise sheet resistance can be obtained regardless of the distance between the probes 34.

The film manufacturing apparatus 1 includes the sputtering unit 6 that laminates the electrically conductive layer 22 on the substrate film 10 that is long in length in the conveyance direction, the conveyance unit 8 that conveys the electrically conductive film 2, and the above-described resistance measurement device 4.

Thus, a defect of the sheet resistance can be precisely detected. Accordingly, the electrically conductive film 2 having the defective sheet resistance can be surely considered or removed. Thus, the electrically conductive film 2 having the furthermore uniform sheet resistance can be manufactured.

The method for manufacturing the electrically conductive film 2 includes the lamination step of laminating the electrically conductive layer 22 on the long-length substrate film 10 to produce the electrically conductive film 2; and the resistance measurement step of measuring the sheet resistance of the electrically conductive film 2 while conveying the electrically conductive film 2 in the conveyance direction and. The resistance measurement step includes the reference voltage measurement step of measuring the reference voltage by allowing the two probes 34 to scan in the width direction without interposing the electrically conductive film 2 between the two probes 34; the actual voltage measurement step of measuring the actual voltage of the electrically conductive film 2 by allowing the two probes 34 to scan in the width direction, the electrically conductive film 2 being interposed between the two probes 34 without being contacted with the two probes 34; and the calculation step of correcting the actual voltage based on the reference voltage, and calculating the sheet resistance of the electrically conductive film 2.

In the method for manufacturing the electrically conductive film 2, the reference voltage is measured before the measurement of the actual voltage. That is, on scanning, a change in the voltage generated by the distance in the up-down direction between the probes 34 is measured as the reference voltage. Then, the actual voltage of the electrically conductive film 2 is corrected based on the measured reference voltage, and the sheet resistance is calculated.

Thus, the sheet resistance, considering the influence of the deviation of the distance in the up-down direction between the probes 34, of the electrically conductive film 2 can be calculated, and the measurement accuracy (preciseness of measurement) of the sheet resistance of the electrically conductive film 2 can be improved. Accordingly, the defect of the sheet resistance of the electrically conductive film 2 can be precisely detected, and the electrically conductive film 2 having the defective sheet resistance can be surely considered or removed. As a result, the electrically conductive film 2 having the uniform sheet resistance can be manufactured.

4. Modified Examples

In the embodiment shown in FIG. 1, the sputtering unit is provided as a lamination unit. Alternatively, for example, a vacuum vapor deposition unit and a chemical vapor deposition unit can be also provided as the lamination unit. In this case, the lamination unit includes a vapor deposition source consisting of a material for the electrically conductive layer 22 instead of the target 16. The lamination unit may be also an application unit, a printing unit, or the like.

In the embodiment shown in FIG. 1, the coil 36 has a generally circular ring shape when viewed from the top. Alternatively, for example, though not shown, the coil 36 can also have a generally rectangular frame shape when viewed from the top. In this case, the length of the side is the same as the above-described diameter.

5. Verification

The measurement was carried out by using the device shown in FIGS. 1 to 3B. To be specific, a non-contact sheet resistance measurement module (double-sided probe-type, manufactured by NAPSON CORPORATION, part number "NC-700V") was used as the measurement unit 31, and the distance D between the probes 34 was set at 10 mm, the diameter of the coil was set at 35 mm, the width of the substrate film 10 was set at 400 mm, the conveyance rate of the substrate film 10 was set at 170 mm/sec, and the scanning rate of the scanning unit 32 was set at 100 mm/sec.

The data of the reference voltage showing a relationship between the position of the probes 34 in the width direction and the voltage at the position was obtained by measuring the voltage (empty voltage) in a state where the electrically conductive film 2 was not interposed, while the probes 34 scan in the width direction. At this time, the probes 34 reciprocate in the width direction once, and an average value of the voltage on the outward way and the voltage on the return way was obtained as the voltage. The data is shown as first plots in a graph of FIG. 5. As the data of the reference voltage, an approximate formula (for example, linear expression or more and hexic expression or less) was produced by using a program in the measurement unit to be shown in FIG. 5. The formula in FIG. 5 shows the approximate formula (quintic expression).

The displacement of the distance in the up-down direction (probe gap displacement) was measured over the width direction, with the distance between the probes 34 of one end portion 26 in the width direction as a reference, by using a dial gauge, so that the data of the position in the width direction of the probe 34 and the probe gap displacement was obtained. The data is shown as second plots in a graph of FIG. 5.

FIG. 5 shows that the data of the reference voltages (first plots) and the data of the probe gap displacements (second plots) show a behavior approximate to each other and make a correlation. That is, it is found that by correcting the voltage value based on the reference voltage value, unevenness of the voltage due to the unevenness of the probe gap displacement can be corrected, and as a result, the influence of the unevenness of the probe gap displacement can be reduced.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The resistance measurement device and the film manufacturing apparatus of the present invention can be applied for various industrial products, and can be, for example, preferably used for manufacturing an electrically conductive film.

DESCRIPTION OF REFERENCE NUMBER

1 Film manufacturing apparatus
2 Electrically conductive film

4 Resistance measurement device
6 Sputtering unit
10 Substrate film
11 Feeding roll
20 Winding roll
22 Electrically conductive layer
25 Conveyance region
32 Scanning unit
33 Arithmetic unit
34 Probe
36 Coil
37 Memory

The invention claimed is:

1. A resistance measurement device for measuring sheet resistance of an electrically conductive film that is long in one direction, comprising:
 two probes disposed to face each other in spaced apart relation so as to allow the electrically conductive film to be interposed therebetween without contacting with the electrically conductive film;
 a scanning unit that allows the two probes to scan in a cross direction crossing the one direction; and
 an arithmetic unit that calculates a sheet resistance of the electrically conductive film based on a voltage measured by the two probes, wherein
 the arithmetic unit
 includes a memory that memorizes a reference voltage measured by allowing the two probes to scan in the cross direction without interposing the electrically conductive film between the probes, and
 corrects, based on the reference voltage, an actual voltage measured by allowing the two probes to scan in the cross direction with the electrically conductive film being interposed between the probes.

2. The resistance measurement device according to claim 1, wherein
 a distance between the two probes is variable.

3. A film manufacturing apparatus for manufacturing an electrically conductive film that is long in one direction, comprising:
 a lamination unit that laminates an electrically conductive layer at a substrate film that is long in the one direction to produce an electrically conductive film;
 a conveyance unit that conveys the electrically conductive film; and
 the resistance measurement device according to claim 1 that measures sheet resistance of the electrically conductive film conveyed by the conveyance unit.

4. A method for manufacturing an electrically conductive film that is long in one direction, comprising:
 a lamination step of laminating an electrically conductive layer at a substrate film that is long in the one direction to produce an electrically conductive film; and
 a resistance measurement step of measuring sheet resistance of the electrically conductive film while conveying the electrically conductive film in the one direction, wherein
 the resistance measurement step includes;
 a reference voltage measurement step of measuring a reference voltage by allowing two probes to scan in a cross direction crossing the one direction without interposing the electrically conductive film between the two probes disposed to face each other in spaced apart relation;
 an actual voltage measurement step of measuring an actual voltage of the electrically conductive film by allowing the two probes to scan in the cross direction, the electrically conductive film being interposed between the two probes without being contacted with the two probes; and
 a calculation step of correcting the actual voltage based on the reference voltage, and calculating the sheet resistance of the electrically conductive film.

* * * * *